(12) United States Patent
Torii

(10) Patent No.: US 12,730,373 B2
(45) Date of Patent: Sep. 8, 2026

(54) IMPRINTING APPARATUS, IMPRINTING METHOD, AND PRODUCT MANUFACTURING METHOD

(71) Applicant: CANON KABUSHIKI KAISHA, Tokyo (JP)

(72) Inventor: Hirotoshi Torii, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 67 days.

(21) Appl. No.: 18/650,550

(22) Filed: Apr. 30, 2024

(65) Prior Publication Data

US 2024/0402593 A1 Dec. 5, 2024

(30) Foreign Application Priority Data

May 29, 2023 (JP) ................................ 2023-088058

(51) Int. Cl.
*G03F 7/00* (2006.01)

(52) U.S. Cl.
CPC .................................. *G03F 7/0002* (2013.01)

(58) Field of Classification Search
CPC ........ G03F 7/0022; G03F 7/0005; G03F 7/00; G03F 7/0002
See application file for complete search history.

(56) References Cited

U.S. PATENT DOCUMENTS

| | | | | |
|---|---|---|---|---|
| 7,420,654 | B2 | 9/2008 | Cherala et al. | |
| 2019/0101823 | A1* | 4/2019 | Patel | G03F 7/0002 |
| 2021/0023768 | A1* | 1/2021 | Shiode | G03F 7/0002 |

FOREIGN PATENT DOCUMENTS

| | | | |
|---|---|---|---|
| JP | 2011079249 | A | 4/2011 |
| JP | 4688872 | B2 | 5/2011 |
| JP | 2018157036 | A * | 10/2018 |
| KR | 1020210122107 | A | 10/2021 |

OTHER PUBLICATIONS

Office Action issued in Korean Appln. No. 10-2024-0069975 mailed on Jan. 27, 2026.

* cited by examiner

*Primary Examiner* — Cedrick S Williams
(74) *Attorney, Agent, or Firm* — ROSSI, KIMMS & McDOWELL LLP

(57) ABSTRACT

An imprinting apparatus that brings a mold with a pattern into contact with an imprinting material applied to a substrate and forms the pattern of the imprinting material on the substrate is provided. The imprinting apparatus includes: an imprinting head including a fixing unit, a movable unit base that is connected via a first flexible member from the fixing unit, a mold holding member that holds the mold, and a second flexible member that connects the movable unit base to the mold holding member; a first driving mechanism configured to drive the imprinting head to bring the mold held by the mold holding member into contact with the imprinting material on the substrate held by a substrate holding unit; a control unit configured to control the first driving mechanism; and a first measurer configured to measure a strain amount or a deformation amount of the second flexible member, or a relative position of the mold holding member or the mold to the movable unit base.

15 Claims, 10 Drawing Sheets

1

1
2
3
3b
4
5
6
7
8
9
10
12
13
14
15
16
18
20
31
32
X
Y
Z

IMPRINTING APPARATUS, IMPRINTING METHOD, AND PRODUCT MANUFACTURING METHOD

BACKGROUND OF THE INVENTION

Field of the Invention

The present invention relates to an imprinting apparatus, an imprinting method, and a product manufacturing method.

Description of the Related Art

With the increasing demand for miniaturization of semiconductor devices and micro electro mechanical systems (MEMS), a microfabrication technology for molding an uncured resin on a substrate with a mold and forming a resin pattern on the substrate has attracted attention in addition to photolithographic technologies of the related art. The technology is also called an imprinting technology and can form a minute structure of several nanometers on a substrate.

In an imprinting technology, there is a photocuring method as one of curing methods for imprinting materials. The photocuring method is a method of curing an imprinting material by radiating light such as ultraviolet light in a state in which the imprinting material supplied (disposed) to a substrate is brought into contact with a mold, and detaching the mold from the cured imprinting material to form a pattern of the imprinting material on the substrate.

In imprinting apparatuses using such an imprinting technology, in addition to miniaturization, there is also increasing demand for overlaying accuracy in patterns formed in stages on a substrate. For example, it is conceivable that an imprinting apparatus be applied to manufacturing of a semiconductor device with a half pitch of about 32 nm.

In this case, according to the international technology roadmap for semiconductors (ITRS), overlaying accuracy of 6.4 nm is required. To realize such high overlaying accuracy, it is necessary to precisely manage relative positions of a substrate and a mold (a position in the horizontal direction and a position in the vertical direction).

In an imprinting apparatus, when an imprinting material of a substrate is brought into contact with a mold (the mold is pressed against the imprinting material), alignment (positioning) for matching a relative position of the substrate with the mold is performed.

Specifically, alignment in the horizontal direction is realized by moving the substrate in the horizontal direction with respect to the mold via a substrate stage so that alignment marks provided on both the substrate and the mold are superimposed.

Alignment in the vertical direction is realized by adjusting a pressing force of the mold against the imprinting material on the substrate via an actuator that drives the mold in the vertical direction. An alignment error in the horizontal direction causes a shift or a deviation in a rotational component and an alignment error in the vertical direction causes strain (distortion) of the substrate or the mold.

Accordingly, in an imprinting apparatus, it is necessary to match the relative positions of the substrate and the mold at an order of nm in any of the horizontal and vertical directions. For the distortion, flatness of a holding surface (holding member) holding the substrate or the mold is an important factor. When the flatness is low, a difference occurs between distortion amounts of the substrate and the mold, which therefore decreases superposition accuracy.

In an imprinting apparatus, there is a possibility of mismatch between relative positions of a holding member that holds a mold and a holding member that holds a substrate due to deformation or vibration by an external force from a driving unit in the apparatus, propagation of floor vibration from the outside of the apparatus, or the like. Accordingly, a structure of the imprinting apparatus is required to keep high rigidity.

Further, since an imprinting apparatus is required to guarantee high superimposition accuracy for a long time, alignment accuracy is also required not to change over time.

Accordingly, as a technology for controlling (managing) a pressing force of a mold against an imprinting material on a substrate, for example, there is a technology for measuring and controlling a pressing force from a driving output (current value) of an actuator. The driving output of the actuator includes mounting rigidity, a resistance force of a preload spring or the like, and a pressing force of a mold against the imprinting material on the substrate.

When a thrust constant is changed due to aging degradation or heat of an actuator, a relation between a driving output of the actuator and the pressing force of the mold against the imprinting material on the substrate is changed. Since a tube, cables, a preload spring, and the like are connected to the holding member (driving side) that holds the mold and a peripheral member (fixing side), the tube, the cables, the preload spring, and the like may become driving resistance.

When the driving resistance changes over time, there is an influence on a pressing force predicted from the driving output of the actuator, which is therefore a factor in decreasing superposition accuracy. As other technologies for controlling the pressing force of the mold against the imprinting material on the substrate, there are Japanese Patent No. 4688872 and Japanese Patent Laid-Open No. 2011-79249.

In Japanese Patent No. 4688872, a chuck body holding a mold is coupled to a flexural material. The flexural material is coupled to an alignment system that controls a motion of the mold. Three actuators are connected at intervals around the alignment systems. Thus, an imprinting head that has the chuck body is driven.

In the case of such a structure, it is necessary to manage an output of an actuator, for example, a pressing force with, an amount of change in a current. However, an imprinting force is easily changed due to a change in reaction of a flexural material, a change in tension of cables or tubes connected to the mold holding unit, or the like, which causes an undesirable force between the mold and the substrate and decreases superimposition accuracy.

Japanese Patent Laid-Open No. 2011-79249 discloses a transfer apparatus that includes a pressing force detection sensor that detects a pressing force when a substrate is pressed by a mold. Accordingly, a pressing force can be directly measured by the pressing force detection sensor.

However, when a mold is brought into contact with an imprinting material on a substrate or the mold is separated, a relatively large force is necessary. Thus, when curing is performed, highly accurate control by a minute force is necessary. Therefore, it is difficult to realize highly accurate control in a broad measurement range as in Japanese Patent Laid-Open No. 2011-79249.

SUMMARY OF THE INVENTION

According to an aspect of the present invention, an imprinting apparatus brings a mold with a pattern into contact with an imprinting material applied on a substrate and forms the pattern of the imprinting material on the substrate. The imprinting apparatus includes: an imprinting head including a fixing unit, a movable unit base that is connected via a first flexible member from the fixing unit, a mold holding member that holds the mold, and a second flexible member that connects the movable unit base to the mold holding member; a first driving mechanism configured to drive the imprinting head to bring the mold held by the mold holding member into contact with the imprinting material on the substrate held by a substrate holding unit; a control unit configured to control the first driving mechanism; and a first measurer configured to measure a strain amount or a deformation amount of the second flexible member, or a relative position of the mold holding member or the mold to the movable unit base, in which the control unit controls driving of the first driving mechanism based on a measurement value output by the first measurer.

Further features of the present invention will become apparent from the following description of embodiments with reference to the attached drawings.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

Configuration of Imprinting Apparatus

Figure 1:
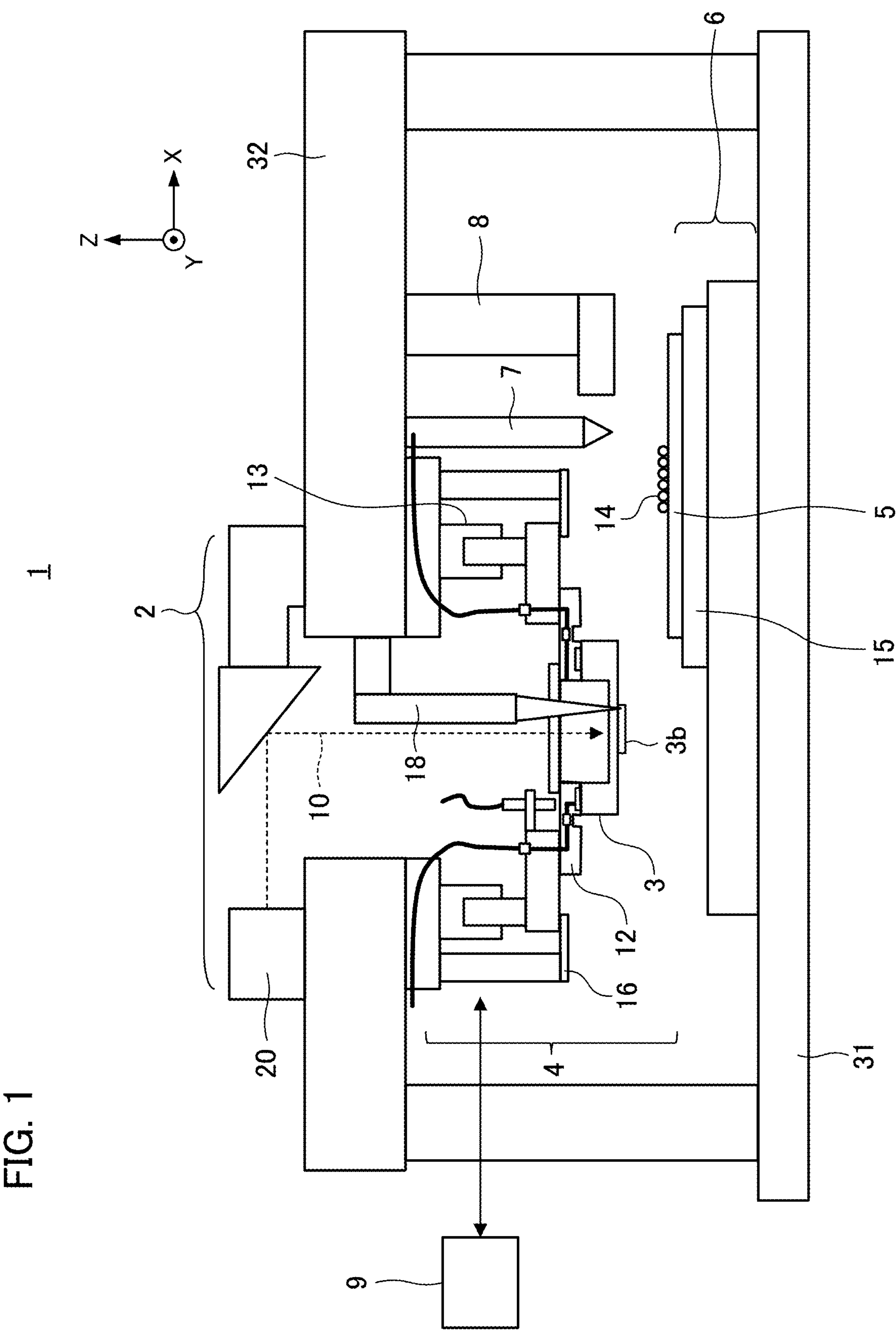
FIG. 1 is a schematic diagram illustrating a configuration of an imprinting apparatus 1.

First, a configuration of an imprinting apparatus according to an embodiment of the present invention will be described. FIG. 1 is a schematic diagram illustrating a configuration of an imprinting apparatus 1.

The imprinting apparatus 1 according to the present embodiment is a processing apparatus that is used for a process of manufacturing a semiconductor device and transfers an uneven pattern of a mold to a wafer (substrate) that is a processed substrate, and an apparatus that adopts a photocuring method in an imprinting technology.

In the following drawings, the Z axis is parallel to a radiation axis of ultraviolet light 10 for a mold 3, the X axis is a movement direction of the waver 5 to a mold holding member 12 to be described below in a plane vertical to the Z axis, and the Y axis is a direction orthogonal to the X axis in description.

The imprinting apparatus 1 according to the present embodiment includes an illumination system unit 2, an imprinting head 4 that holds the mold 3, a wafer stage 6 that holds the wafer 5, an application device 7, a mold transport device 8, and a control device 9.

The illumination system unit 2 is an illumination unit that radiates the ultraviolet light 10 to the mold 3 and functions as a radiation unit. Specifically, the illumination system unit 2 irradiates the imprinting material 14 with the ultraviolet light 10 that is energy for curing with the mold 3 having been brought into contact with the imprinting material 14 on the wafer 5.

The illumination system unit 2 includes a light source 20 and a plurality of optical elements that adjusts the ultraviolet light 10 emitted from the light source 20 to light appropriate for an imprinting process.

The mold 3 has a rectangular outer circumference and has a protrusion 3*b* of tens of um on a surface facing the wafer 5 during an imprinting process. A predetermined pattern (for example, an uneven pattern such as a circuit pattern) is formed in a 3-dimensional shape in the protrusion 3*b*. The surface of the uneven pattern is processed to a highly flat surface in order to keep adhesion with the surface of the wafer 5.

The mold 3 has a hollowed portion 3*a* (cavity) and inflates and deforms the hollowed portion 3*a* by pressurization when the mold 3 is brought into contact with the imprinting material 14 on the wafer 5. Accordingly, it is possible to shorten a time taken to fill to an uneven pattern with the imprinting material 14. A material of the mold 3 is a material such as quartz capable of transmitting ultraviolet light.

The imprinting head 4 is fixed to a bridge surface plate 32 supported by a base plate surface 31. The imprinting head 4 includes a mold holding member 12 that attracts and holds the mold 3 by an adsorption force or an electrostatic force. The imprinting head 4 includes an imprinting actuator 13 (first driving mechanism).

The imprinting actuators 13 are disposed at three locations in the horizontal direction centering on the mold 3 held by the mold holding member 12. The imprinting actuators 13 can drive the mold holding member 12 in the Z axis and a tilt direction in order to press the mold 3 against the imprinting material 14 applied (supplied) to the wafer 5.

The imprinting actuator 13 is preferably a linear motor. The imprinting actuator 13 includes a plate spring (first flexible unit) 16 in the vicinity of each actuator as an imprinting driving guide. The plate spring 16 has flexibility in the Z direction and keeps rigidity in other directions.

Accordingly, it is possible to prevent superimposition accuracy from decreasing due to vibration while enabling imprinting driving. Here, imprinting is an operation of pressing (bringing) the mold 3 against (into contact with) the imprinting material 14 applied to the wafer 5.

The wafer 5 is, for example, a processed substrate formed of a monocrystal silicon substrate or a silicon on insulator (SOI) substrate, and the imprinting material 14 that is a forming unit is applied to the processed surface.

The wafer stage 6 is a substrate holding member that holds the wafer 5 and can freely move on an XY plane in the imprinting apparatus 1. As the actuator driving the wafer stage 6, a linear motor can be adopted, but the present invention is not particularly limited thereto. The wafer holding member 15 is disposed on the wafer stage 6 and holds the wafer 5 by vacuum adsorption.

The application device (dispenser) 7 is an application unit that applies the uncured imprinting material 14 to the wafer 5.

A curable composition (also referred to as a resin in an uncured state) that is cured by applying energy for curing is used for the imprinting material 14 is used. As the energy for curing, electromagnetic waves, heat, or the like is used.

As the electromagnetic waves, for example, light such as infrared light, visible light, or ultraviolet light selected from a range of a wavelength equal to or greater than 10 nm and equal to or less than 1 mm is used. In the present embodiment, an example in which the ultraviolet light 10 is used as the energy for curing will be described.

That is, in the present embodiment, the imprinting material 14 is an ultraviolet curing resin that is cured by receiving the ultraviolet light 10 from the illumination system unit 2. The imprinting material 14 is appropriately selected according to a type of semiconductor device that is manufactured. The imprinting material 14 may be a thermoplastic or thermosetting resin.

The curable composition is a composition that is cured by light irradiation or heating. A photocurable composition that is cured by light irradiation may contain at least a polymerizable compound and a photoinitiator and may contain a non-polymerizable compound or a solvent as necessary. The non-polymerizable compound is at least one selected from a group consisting of a sensitizer, a hydrogen donor, an internally added release agent, a surfactant, an antioxidant, a polymer component, and the like.

The mold transport device 8 is a transport unit that transports the mold 3 to install the mold 3 in the mold holding member 12.

An alignment scope 18 observes the alignment marks provided in the wafer 5 and the mold 3 in the imprinting process. In normal imprinting, the mold 3 is pressed against the imprinting material 14 applied to the wafer 5.

For the relative positions of the wafer 5 and the mold 3 in the horizontal direction during the pressing, superimposition of the alignment marks of both the wafer 5 and the mold 3 are measured by the alignment scope 18 provided in the imprinting head 4. Positioning is performed by controlling the position of the wafer stage 6 so that the relative positions of the wafer 5 and the mold 3 in the horizontal direction become desired positions.

The control device 9 is a control unit that controls an operation, adjustment, and the like of each constituent element of the imprinting apparatus 1 based on a measurement value output by each detector. That is, the control device 9 functions as a control unit. Specifically, the control device 9 controls driving of the imprinting actuator 13 based on a value output by a displacement sensor 17 to be described below.

The control device 9 is configured with a computer, a sequencer, or the like that includes a storage unit such as a magnetic storage medium and is connected to each constituent element of the imprinting apparatus 1 by a line and includes a central processing unit (CPU) although not illustrated.

Each constituent element is controlled by a program or a sequence. The control device 9 may be integrated with the imprinting apparatus 1 or may be installed at a different place from the imprinting apparatus 1 and controlled remotely.

First Embodiment

Figure 2A:
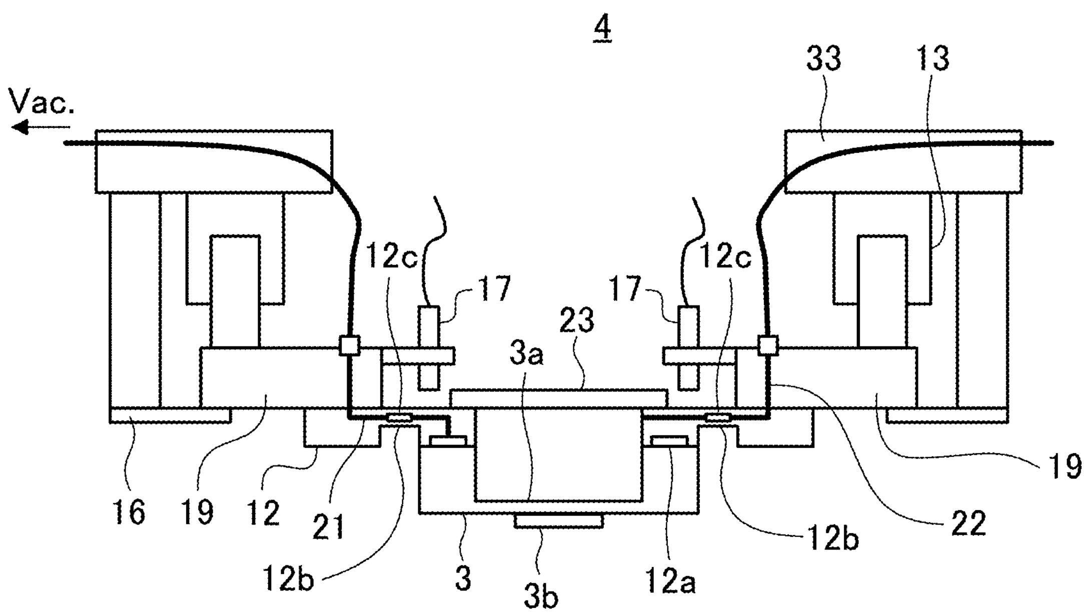
FIGS. 2A and 2B are schematic diagrams illustrating a structure of an imprinting head according to a first embodiment.
Figure 2B:
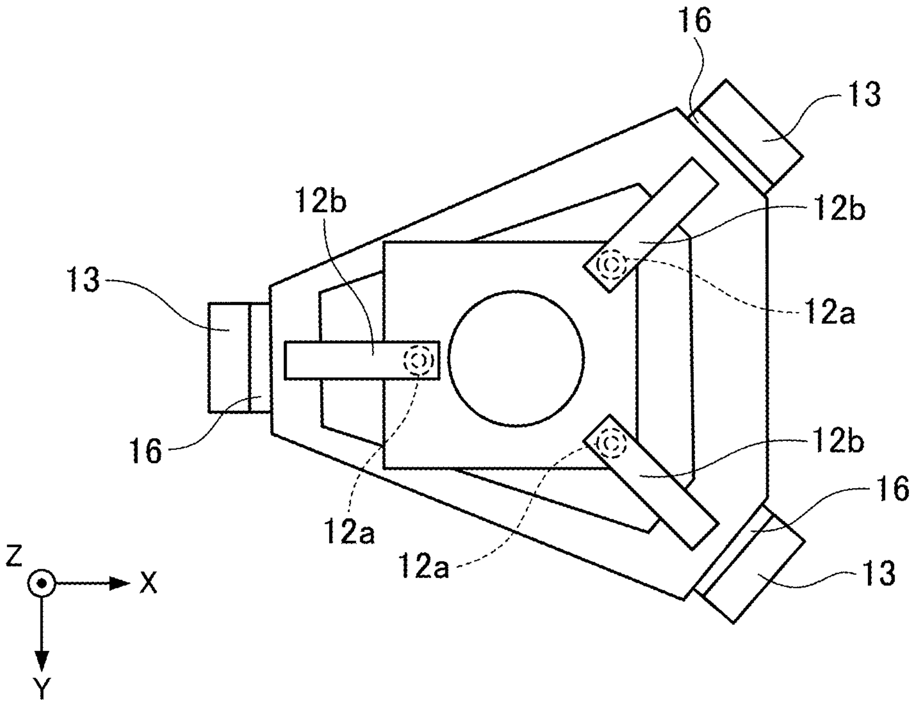

Next, an imprinting apparatus according to a first embodiment of the present invention will be described. FIGS. 2A and 2B are schematic diagrams illustrating a structure of the imprinting head 4 according to the first embodiment.

FIG. 2A is a sectional view illustrating a structure of the imprinting head 4 according to the first embodiment. FIG. 2B is a top view illustrating the structure of the imprinting head 4 according to the first embodiment.

The mold holding member 12 is connected to a movable unit base 19. The movable unit base 19 is connected via the plate spring 16 from the fixing unit 33 that fixes the imprinting head to the bridge surface plate 32. The mold holding member 12 absorbs and holds the mold 3 by a mold adsorption unit 12*a*.

A pipeline 21 is a gas pipeline that connects a vacuum path to the mold adsorption unit 12*a*. A pipeline 22 is a path that adjusts a pressure of the rear surface of the mold 3 and a gas pipeline that connects the hollowed portion 3*a* to a pressure regulation valve.

A glass cover 23 is provided in an upper portion of the mold holding member 12 to form a closed space (cavity space) of the hollowed portion 3*a* and allows the ultraviolet light 10 to be transmitted there through to a pattern portion formed in the protrusion 3*b*.

The mold holding member 12 includes a plurality of flexible units (second flexible units) 12*b* that are flexible in the Z direction. The flexible units 12*b* connect the movable unit base 19 to the mold holding member 12. In the present embodiment, the flexible units 12*b* are disposed at three locations in the horizontal direction centering on the mold 3 held by the mold holding member 12 and at positions overlapping with the imprinting actuators 13 when viewed in a mold direction.

The flexible units 12*b* have cavity portions 12*c* therein and the pipelines 21 and 22 for adsorbing the mold or inflating the mold are disposed in the spaces in the cavity portions 12*c*, and thus the pipelines 21 and 22 can be held. It is desirable that the flexible units 12*b* be bendable only in the Z direction and maintain their rigidity in other directions as in the plate springs 16.

In FIGS. 2A and 2B, the flexible units 12*b* are illustrated as members integrated with the mold holding member 12 (the same member), but may be coupled as separate members.

The displacement sensor 17 is a measurer (first measurer) and a detector that measures a relative position of the mold holding member 12 or the mold 3 to the movable unit base 19.

Figure 3A:
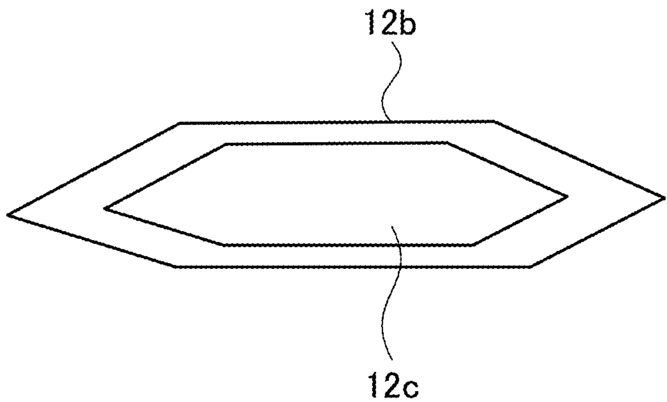
FIGS. 3A and 3B are schematic diagrams illustrating a flexible unit.
Figure 3B:
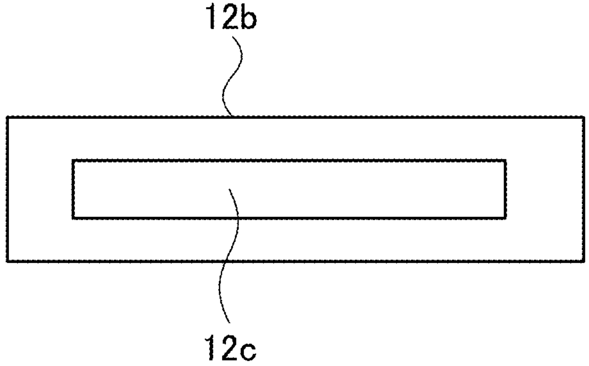

Here, the flexible unit 12*b* will be described with reference to FIGS. 3A and 3B. FIGS. 3A and 3B are schematic diagrams illustrating the flexible unit 12*b*. FIG. 3A illustrates a first example of a cross-sectional surface of the flexible unit 12*b* and the cavity portion 12*c*. In FIG. 3A, the external form of the cross-sectional shape of the second flexible unit 12*b* and the cavity portion 12*c* are hexagonal.

FIG. 3B illustrates a second example of the cross-sectional shape of the flexible unit 12*b* and the cavity portion 12*c*. In FIG. 3B, the external form of the cross-sectional shape of the flexible unit 12*b* and the cavity portion 12*c* are rectangular. All the flexible units 12*b* are formed to surround the cavity portions 12*c* within thin walls and can be bent with a weak force in an imprinting direction (the −Z direction).

The flexibility is higher than that of the plate spring 16. That is, the rigidity of the flexible unit 12*b* is lower than that of the plate spring 16. As illustrated in FIG. 3B, when the external form of the cross-sectional shape of the second flexible unit 12*b* and the cavity portion 12*c* are rectangular, there is an advantage that manufacturing is easy.

On the other hand, as illustrated in FIG. 3A, when the external form of the cross-sectional shape of the second flexible unit 12*b* and the cavity portion 12*c* are hexagonal, there is an advantage that bending is easy.

Figure 4:
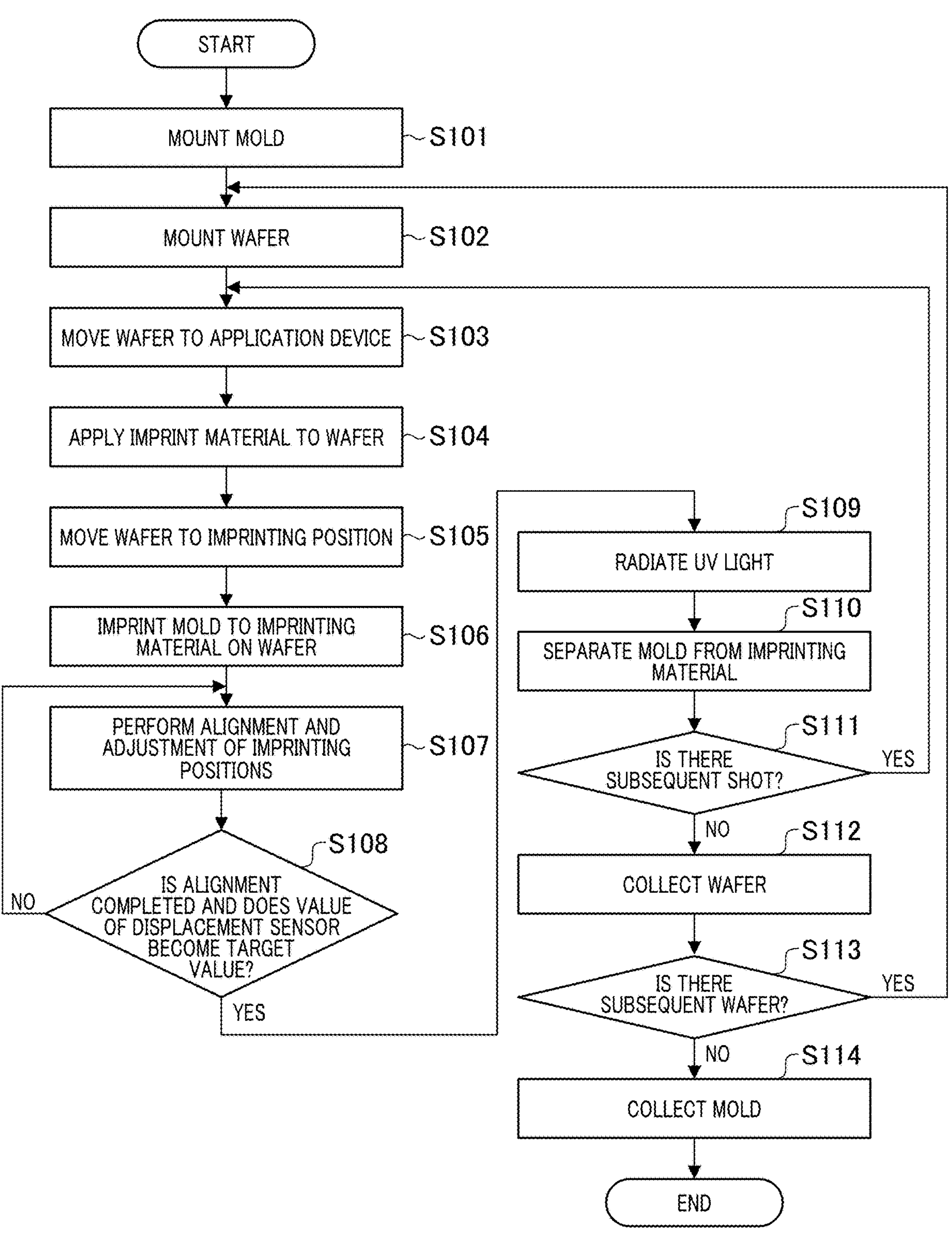
FIG. 4 is a flowchart illustrating an operation sequence of an imprinting apparatus according to the first embodiment.

Next, an operation of the imprinting apparatus 1 will be described. FIG. 4 is a flowchart illustrating an operation sequence of an imprinting apparatus according to the first embodiment. Specifically, FIG. 4 illustrates an operation sequence of forming a pattern that is an uneven layer on the wafer 5 in an imprinting process by the imprinting apparatus 1 when the plurality of wafers 5 are processed.

Each operation (step) of the flowchart can be performed under the control of the control device 9. In one lot including the plurality of wafers 5, it is assumed that the same mold 3 is used.

In S101, first, the mold 3 is transported to a position immediately below the mold holding member 12 by the mold transport device 8, and the mold 3 is mounted on the mold holding member 12. In other words, the mold 3 is held by the mold holding member 12.

Subsequently, in S102, the wafer 5 is transported to the wafer stage 6 by a wafer transport device (not illustrated), and the wafer 5 is mounted on the wafer stage 6. In other words, the wafer 5 is held by the wafer stage 6.

In S103, the wafer stage 6 is moved to an application position of an imprinting material, specifically, a position immediately below the application device 7. In S104, the imprinting 14 is applied to the wafer 5 by the application device 7.

In S105, the wafer 5 is moved to an imprinting position below the imprinting head 4. Specifically, the wafer stage 6 is moved so that a shot of an imprinting target arrives at a position immediately below the mold 3.

In S106, the mold 3 is brought into contact with (imprinted in) the imprinting material 14 on the wafer 5. Several tens of Newton (N) is applied in a state in which an internal pressure of the hollowed portion 3*a* is pressurized before the mold 3 is brought into contact with the imprinting material 14 on the wafer 5.

An internal pressure and an imprinting force (a force in the direction of the wafer 5) are weakened at a timing at which the protrusion 3*b* in which a mold pattern is formed is filled with the imprinting material 14, and thus the internal pressure approaches a gauge pressure of 0 and the imprinting force approaches 0 N.

In S107, position adjustment (alignment) is performed with the wafer stage 6 so that positions of a mark on the mold 3 and a mark on the wafer 5 are measured by the alignment scope 18 and become desired positions.

Figure 5:
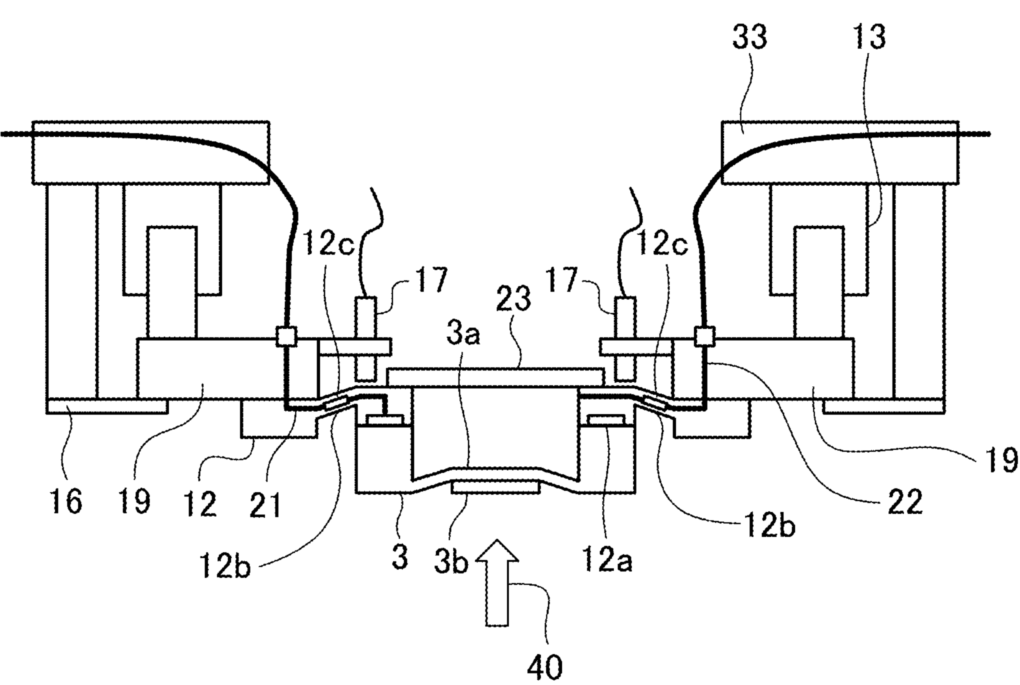
FIG. 5 is a schematic diagram illustrating a modification when a force is applied to a mold in imprinting.

Here, a process of S107 according to the present embodiment will be described in detail with reference to FIG. 5. FIG. 5 is a schematic diagram illustrating a modification when a force is applied to the mold 3 in imprinting.

When a force 40 is applied in the +Z direction through the imprinting, the circumference of the mold 3 is also moved in the +Z direction using the flexible units 12*b* as starting points. By measuring this movement amount by the displacement sensor 17, it is possible to calculate a force applied to the mold 3 in the printing.

That is, in S107, a driving amount of the imprinting actuator 13 is controlled based on an amount of change from a measurement value output by the displacement sensor 17 before the mold 3 is brought into contact with the imprinting material 14 on the wafer 5. A relation between the imprinting force and the displacement amount at the measurement position may be acquired in advance and an output of the imprinting actuator 13 may be controlled using the relation.

As an imprinting operation, the imprinting material 14 applied to the wafer 5 can once be expanded by applying a relatively large force (several tens of N) and this force is gradually weakened. The alignment (positioning) between the wafer 5 and the mold 3 are performed simultaneously and this force approaches 0 immediately before the ultraviolet light 10 is radiated.

At this time, a value of an output of the displacement sensor 17 during no load is set as a target value, and the output of the imprinting actuator 13 is controlled so that the value during no load is obtained. The output of the displacement sensor 17 during no load may be set as a reference and the output may be controlled using the reference as a target value.

A value of the displacement sensor 17 is preferably set as a target value when the illumination system unit 2 starts radiating the ultraviolet light 10. By performing such control, it is possible to minimize distortion of the protrusion 3*b* of the mold 3 and transfer a highly accurate pattern to the wafer.

Further, since driving before the radiation of the ultraviolet light 10 such as an operation of descending the imprinting head 4 does not require highly accurate control, the output may be controlled directly with a driving output (current value) of the imprinting actuator 13.

That is, in course of an operation of bringing the mold 3 into contact with the imprinting material 14 on the wafer 5, control of the driving of the imprinting actuator 13 is switched from the control that is based on the current value of the imprinting actuator 13 to control that is based on a value of the displacement sensor 17. Through such control, it is possible to reduce a load applied to the control.

Referring back to FIG. 4, in S108, the control device 9 determines whether the mold 3 and the wafer 5 have a target positional relation, that is, the alignment is completed. It is determined whether a value of the displacement sensor 17 becomes a target value.

When the alignment is not completed and the value of the displacement sensor 17 does not become the target value (NO), S108 is repeated. Conversely, when the alignment is completed and the value of the displacement sensor 17 does not become the target value (YES), the process proceeds to S109.

In S109, the imprinting material 14 on the wafer 5 is cured by radiating the ultraviolet light 10 from the illumination system unit 2.

After the radiation is completed, in S110, the imprinting head 4 is driven by the imprinting actuators 13 to move the mold 3 in a lifting direction and detach (separate) the mold 3 from the imprinting material 14 on the wafer 5. The operation of S110 is referred to as a separation.

In S111, it is determined whether there is a subsequent shot in which the imprinting is performed consecutively. That is, it is determined whether there is an unpressed shot in the wafer 5. When there is the unprocessed shot (YES), the processes of S103 to S110 are repeated. Conversely, when there is no unpressed shot (NO), the process proceeds to S112.

In S112, the wafer 5 on which the imprinting process is completed is collected. Specifically, the wafer 5 is taken out by the wafer transport device.

In S113, it is determined whether there is the unpressed wafer 5. When there is the unpressed wafer 5 (YES), the processes of S102 to S110 are repeated. Conversely, when there is no unpressed wafer 5 (NO), the process proceeds to S114.

When the imprinting process ends in all the wafer 5 in the lot, the mold 3 is collected in S115. Specifically, the mold 3 is taken out by the mold transport device 8. The series of processes ends.

In the present embodiment, the displacement sensors 17 and the imprinting actuators 13 are disposed at three locations and at positions of intervals of about 120 degrees centering on the mold 3. The displacement sensors 17 and the imprinting actuators 13 are disposed at overlapping positions (azimuths) and, preferably, in the same direction, when viewed from the center of the mold 3.

Therefore, the displacement sensors 17 can take correlation with outputs of the imprinting actuators 13, also including inclinations. Here, the displacement sensors 17 may be disposed at four locations except for a case in which the degree of freedom in the disposition is limited.

The flexible unit 12*b* may be provided in the cavity space and is preferably provided outside of the cavity space. This is because the flexible unit 12*b* is rarely deformed due to a pressure in the cavity space when the flexible unit 12*b* is provided outside of the cavity space.

Here, when the flexible unit 12*b* is deformed due to an imprinting force, it is important to provide wirings and pipelines in an opposite direction (the movable unit base 19 side) to the mold 3 rather than the flexible unit 12*b* so that a change in resistance of the wirings and pipelines is not taken.

Since an output of the displacement sensor 17 is affected by the own weight of each component, disturbance, or the like, it is necessary to measure an output in advance in a state where the imprinting force is not applied and use an amount of change for control from the state in which the imprinting force is not applied in the imprinting.

In the present embodiment, the example in which the displacement sensor 17 is used has been described, but a relative position of the mold holding member 12 or the mold 3 to the movable unit base 19 may be measurable, but the present invention is not limited thereto. For example, an angle sensor (angle detector) may be used instead of the displacement sensor 17.

As described above, according to the present embodiment, superimposition accuracy of the mold and the substrate can be improved.

Second Embodiment

Figure 6:
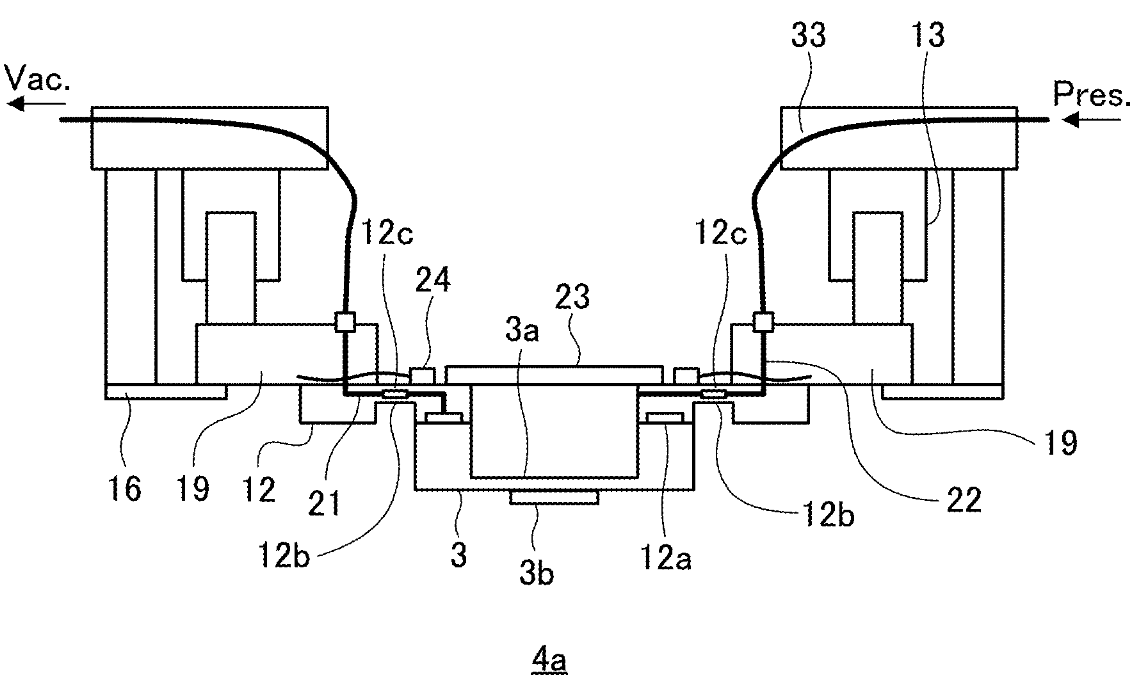
FIG. 6 is a sectional view illustrating a structure of an imprinting head according to a second embodiment.

Next, an imprinting apparatus according to a second embodiment of the present invention will be described. FIG. 6 is a sectional view illustrating a structure of an imprinting head 4*a* according to the second embodiment.

In the present embodiment, a strain gauge 24 is used instead of the displacement sensor 17. The strain gauge 24 is a measurer (first measurer) that measures a strain amount or a deformation amount of the flexible unit 12*b*.

By adhering the strain gauge 24 to a portion in which a strain increases when the flexible unit 12*b* is deformed, for example, a portion of the flexible unit 12*b* in which a cross-sectional area is considerably reduced with respect to the mold adsorption unit 12*a*, it is possible to improve detection sensitivity. When the strain gauge 24 is used instead of the displacement sensor 17, space saving can be achieved at a low cost compared to the first embodiment.

The flexible unit 12*b* is also deformed due to a pressure of the cavity portion 12*c*. That is, since an output of the strain gauge 24 is affected by adsorption of the mold 3, pressurization of the hollowed portion 3*a*, or the like, an output in a state in which an imprinting force is not applied is measured in advance. In the imprinting, it is necessary to use an amount of change from the state in which the imprinting force is not applied for control of the imprinting actuator 13.

Third Embodiment

Figure 7:
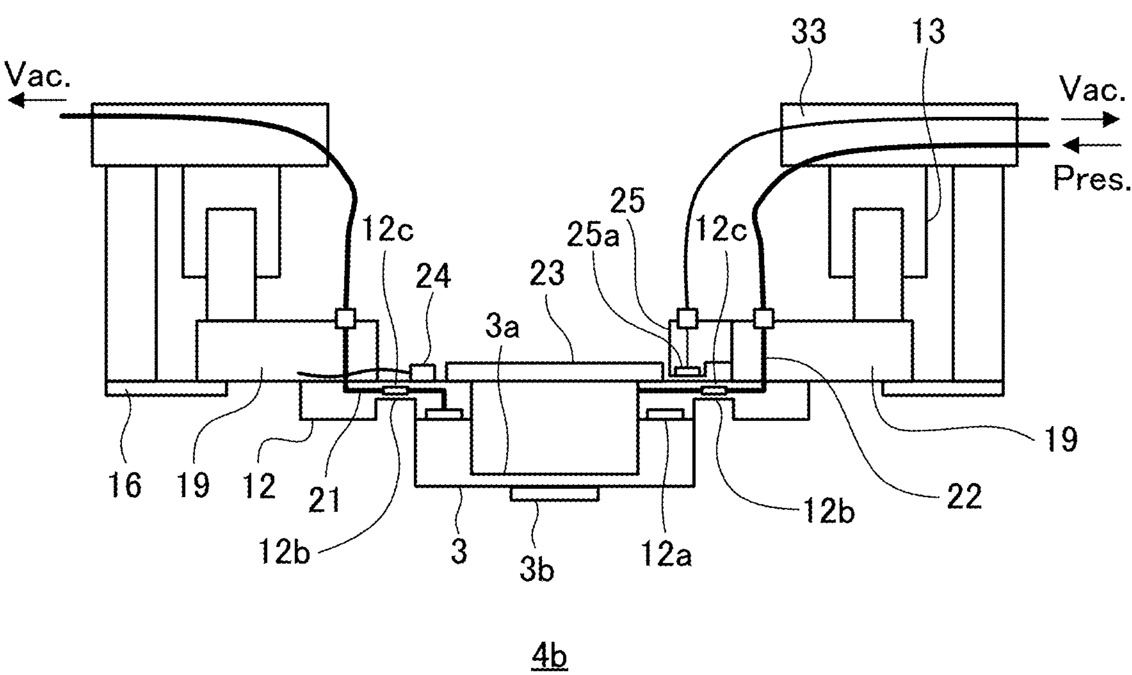
FIG. 7 is a sectional view illustrating a structure of an imprinting head according to a third embodiment.

Next, an imprinting apparatus according to a third embodiment of the present invention will be described. FIG. 7 is a sectional view illustrating a structure of an imprinting head 4*b* according to the third embodiment. In the present embodiment, a fixing member 25 (holding mechanism) that temporarily fixes (holds) the mold holding member 12 is used.

The fixing member 25 adsorbs and holds a part of the mold holding member 12 fixed to the movable unit base 19 and located on the side mold center with respect to the flexible unit 12*b*. The fixing member 25 includes an adsorption unit 25*a* that adsorbs and holds a part of the mold holding member 12. The adsorption unit 25*a* adsorbs and holds a part of the mold holding member 12 by vacuum adsorption.

In an imprinting operation of pressing the mold 3 against the imprinting material 14 on the wafer 5 and in a separation operation of detaching the mold 3 from the imprinting material 14 on the wafer 5, a large force of several tens of N is necessary.

The fixing member 25 prevents the flexible unit 12*b* from being damaged due to the force. Alternatively, to enhance responsiveness of the imprinting operation and the separation operation, a motion of the mold adsorption unit 12*a* is suppressed.

Specifically, the control device 9 causes the adsorption unit 25*a* of the fixing member 25 to hold a part of the mold holding member 12 by the vacuum adsorption in the imprinting operation or the separation operation. According to the present invention, it is possible to reduce damage of the flexible unit 12*b* and improve a throughput.

Fourth Embodiment

Figure 8:
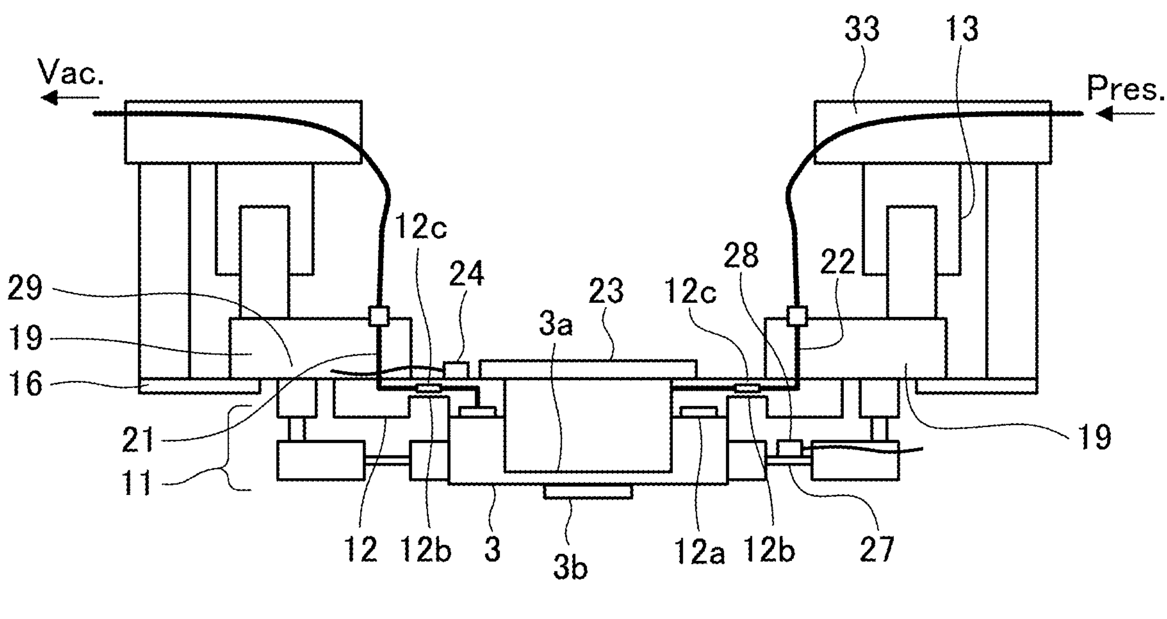
FIG. 8 is a sectional view illustrating a structure of an imprinting head according to a fourth embodiment.

An imprinting apparatus according to a fourth embodiment of the present invention will be described. FIG. 8 is a sectional view illustrating a structure of an imprinting head 4*c* according to the fourth embodiment.

In the present embodiment, the imprinting apparatus includes a magnification correction mechanism 11. The magnification correction mechanism 11 changes a pattern shape on the mold 3 and approaches the shape or magnification to an existing pattern on the wafer 5 by applying a compression force force with an actuator (not illustrated) from the side surface of the mold 3.

The magnification correction mechanism 11 includes a flexible member 27 (third flexible member) that extends in the horizontal direction and has flexibility in an imprinting direction and is configured such that a force in the vertical direction is applied to the mold 3. The magnification correction mechanism 11 is fixed to a fixing unit 29 opposite to the mold 3 with respect to the flexible unit 12*b*.

A strain gauge 28 (second measurer) is pasted near the flexible member 27. The strain gauge 28 measures a strain amount or a deformation amount generated near the flexible member 27. In the case of this configuration, when an imprinting force is applied, a strain occurs not only in the flexible unit 12*b* but also in the flexible member 27.

That is, strains are output to both the strain gauges 24 and 28. When a compression force is given in advance to the magnification correction mechanism 11, a strain is also applied by the compression force in some cases. In that time, the imprinting actuator 13 is controlled using an output difference when a strain output obtained by applying only the compression force is applied and when an imprinting force is applied.

In this way, based on outputs of both the strain gauges 24 and 28, an imprinting force during radiation of ultraviolet light, that is, a driving amount of the imprinting actuator 13, is controlled. Through this control, an imprinting force can be adjusted with high accuracy and imprinting can be performed with small deformation of the mold 3 even in the imprinting apparatus that includes the magnification correction mechanism 11.

Fifth Embodiment

Figure 9:
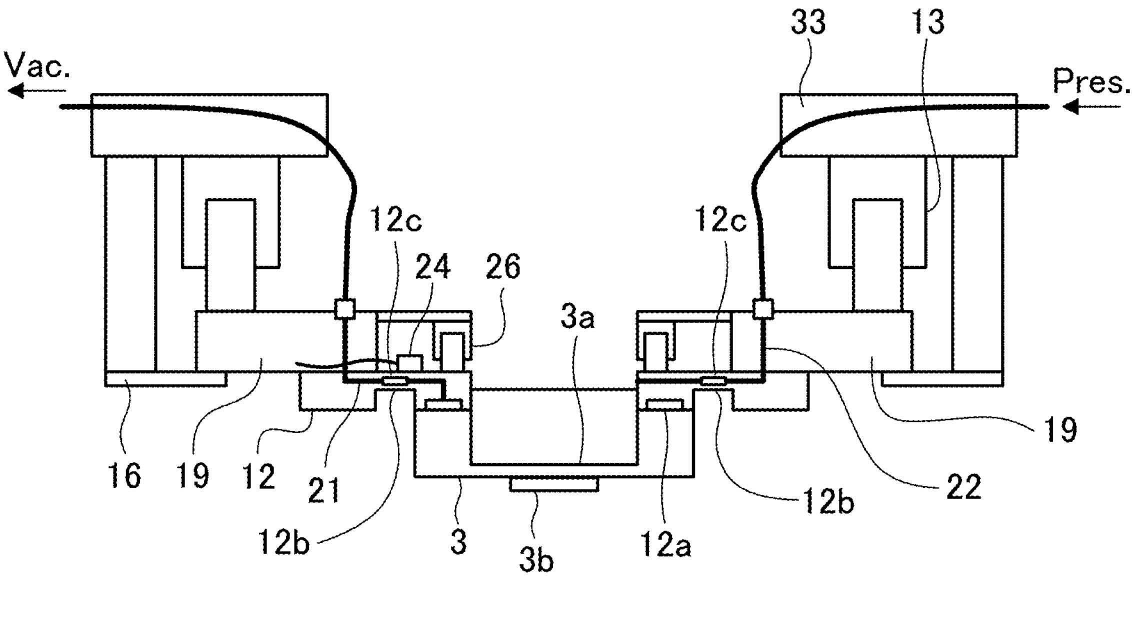
FIG. 9 is a sectional view illustrating a structure of an imprinting head according to a fifth embodiment.

An imprinting apparatus according to a fifth embodiment of the present invention will be described. FIG. 9 is a sectional view illustrating a structure of an imprinting head 4*d* according to the fifth embodiment.

In the present embodiment, the imprinting apparatus includes an actuator 26 (second driving mechanism) in addition to the imprinting actuator 13. The actuator 26 can apply a force to the mold holding member 12 in the Z direction in which the flexible unit 12*b* is easily bent.

The actuator 26 is disposed on the side of a mold center with respect to the flexible unit 12*b* and can generate a force or displacement of a part of the mold holding member 12 in an imprinting direction. The control device 9 controls the actuator 26 to correct a position of the mold holding member 12 when the illumination system unit 2 starts radiating the ultraviolet light 10.

That is, after the mold 3 is moved at a given distance with respect to the wafer 5 by the imprinting actuator 13, minute adjustment (correction) at the time of radiation of the ultraviolet light is performed using the actuator 26. According to the present embodiment, it is possible to perform dynamic control by the imprinting force.

Embodiment of Product Manufacturing Method

A pattern of a cured object formed using the imprinting apparatus is used performantly for at least some of various products or temporarily when various products are manufactured. The products are electric circuit elements, optical elements, MEMS, recording elements, sensors, and molds.

Examples of the electric circuit elements include volatile or nonvolatile semiconductor memories such as a DRAM, an SRAM, a flash memory, an MRAM and semiconductor elements such as an LSI, a CCD, an image sensor, and an FPGA. Examples of the molds include molds or the like for imprinting.

A pattern of a cured object is used as a member configured as at least a part of the product as it is or is used temporarily as a resist mask. The resist mask is removed after etching, ion implanting, and the like are performed in a substrate processing step.

Figure 10A:
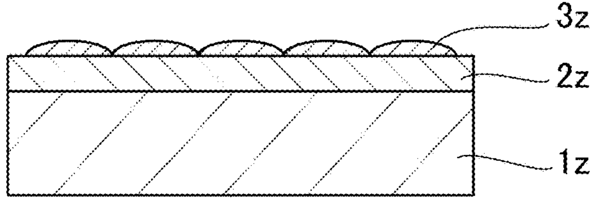
FIGS. 10A to 10F are diagrams illustrating a product manufacturing method.

Next, a specific method of manufacturing a product will be described. As illustrated in FIG. 10A, a substrate 1*z* such as a silicon wafer that has a surface on which a processed material 2*z* such as an insulator is formed is prepared. Subsequently, a composition 3*z* is applied to the surface of the processed material 2*z* by an inkjet method or the like. Here, as illustrated, the composition 3*z* formed by a plurality of liquid droplets is given on the substrate.

Figure 10B:
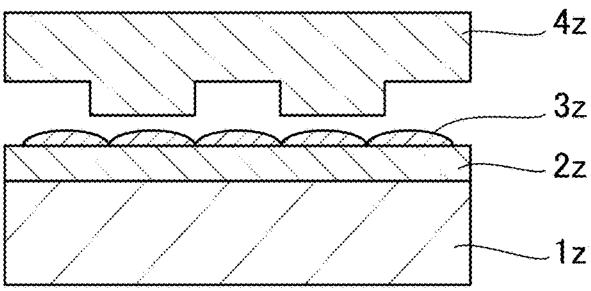
Figure 10C:
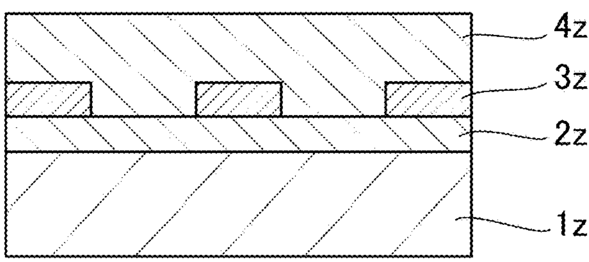

As illustrated in FIG. 10B, the side of an imprinting mold 4*z* on which an uneven pattern is formed faces the composition 3*z* on the substrate. As illustrated in FIG. 10C, the substrate 1*z* to which the composition 3*z* is given is brought into contact with the mold 4*z* and a pressure is applied.

A gap between the mold 4*z* and the processed material 2*z* is filled with the composition 3*z*. The composition 3*z* is cured when light serving as energy for imprinting is radiated and transmitted through the mold 4*z* in this state.

Figure 10D:
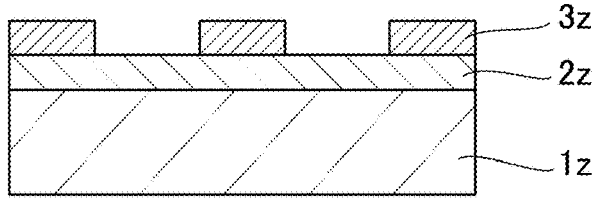

As illustrated in FIG. 10D, when the composition 3*z* is cured and then the mold 4*z* is separated from the substrate 1*z*, a pattern of the cured object of the composition 3*z* on the substrate 1*z* is formed. The pattern of the cured object has a shape in which has recessed portions of the mold correspond to bulged portions of the cured object and bulged portions of the mold correspond to recessed portions of the cured object, that is, the uneven pattern of the mold 4*z* is transferred to the composition 3*z*.

Figure 10E:
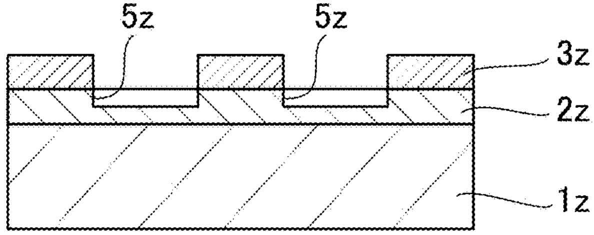

As illustrated in FIG. 10E, when etching is performed using the pattern of the cured pattern as a mask, portions of the surface of the processed material 2*z* where there is no cured object or the cured portion remains thinly are removed to form grooves 5*z*.

Figure 10F:
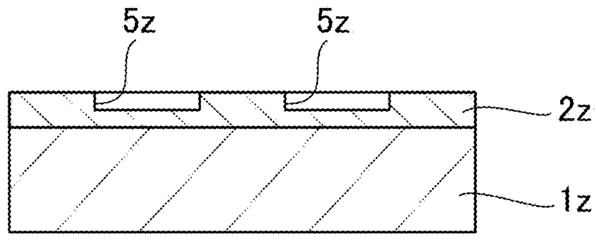

As illustrated in FIG. 10F, when the pattern of the cured object is removed, a product in which the grooves 5*z* are formed on the surface of the processed material 2*z* can be obtained. Here, the pattern of the cured object is removed. However, the pattern of the cured object may not be removed even after the processing and, for example, the pattern may be used as an inter-layer insulation film included in a semiconductor element or the like, that is, as a member configured in the product.

The example in which a circuit pattern transfer mold in which an uneven pattern is provided is used as the mold 4*z* has been described, but the mold may be a mold that has a flat surface with no uneven pattern (flat template).

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the imprinting apparatus or the like through a network or various storage media. Then, a computer (or a CPU, an MPU, or the like) of the imprinting apparatus or the like may be configured to read and execute the program. In such a case, the program and the storage medium storing the program configure the present invention.

In addition, the present invention includes those realized using at least one processor or circuit configured to perform function of the embodiments explained above, for example. Dispersion processing may be performed using a plurality of processors.

This application claims the benefit of priority from Japanese Patent Application No. 2023-088058, filed on May 29, 2023, which is hereby incorporated by reference herein in its entirety.

What is claimed is:

1. An imprinting method of bringing a mold with a pattern into contact with an imprinting material applied on a substrate and forming the pattern of the imprinting material on the substrate, the method comprising:

driving an imprinting head using a first driving mechanism to bring the mold held by a mold holding member into contact with the imprinting material on the substrate held by a substrate holding unit, the imprinting head including a fixing unit, a movable unit base that is connected via a first flexible member from the fixing unit, the mold holding member that holds the mold, and a second flexible member that connects the movable unit base to the mold holding member and that is flexible in a first direction;

measuring a strain amount or a deformation amount of the second flexible member caused by a movement of the second flexible member in the first direction, or a relative position of the mold holding member or the mold to the movable unit base by measuring a movement amount of the second flexible member in the first direction; and controlling driving of the first driving mechanism based on a measurement value output by the measuring.

2. A product manufacturing method comprising:

forming a pattern on the substrate by using the imprinting method according to claim 1;

processing the substrate on which a pattern is formed in the forming; and manufacturing a product from the substrate processed in the processing.

3. An imprinting apparatus that brings a mold with a pattern into contact with an imprinting material applied on a substrate and forms the pattern of the imprinting material on the substrate, the imprinting apparatus comprising:

an imprinting head including a fixing unit, a movable unit base that is connected via a first flexible member from the fixing unit, a mold holding member that holds the mold, and a second flexible member that connects the movable unit base to the mold holding member and that is flexible in a first direction;

a first driving mechanism configured to drive the imprinting head in the first direction to bring the mold held by the mold holding member into contact with the imprinting material on the substrate held by a substrate holding unit;

a control unit configured to control the first driving mechanism; and a first measurer configured to measure a strain amount or a deformation amount of the second flexible member caused by a movement of the second flexible member in the first direction, or a relative position of the mold holding member or the mold to the movable unit base by measuring a movement amount of the second flexible member in the first direction, wherein the control unit controls driving of the first driving mechanism based on a measurement value output by the first measurer.

4. The imprinting apparatus according to claim 3, wherein the control unit controls a driving amount of the first driving mechanism during the contact based on an amount of change from a measurement value output by the first measurer before the contact.

5. The imprinting apparatus according to claim 3, wherein the first measurer is one of a strain gauge, an angle detector, and a displacement sensor.

6. The imprinting apparatus according to claim 3, wherein first driving mechanisms are disposed at three locations in a horizontal direction centering on the mold held by the mold holding member, and wherein second flexible members are disposed at three locations in the horizontal direction centering on the mold held by the mold holding member and are disposed at a position overlapping with the first driving mechanism when viewed from the center of the mold.

7. The imprinting apparatus according to claim 3, wherein, in course of an operation of bringing the mold into contact with the imprinting material on the substrate, the control unit switches control of driving of the first driving mechanism from control that is based on a current value of the first driving mechanism to control that is based on a measurement value output by the first measurer.

8. The imprinting apparatus according to claim 3, further comprising:

a holding mechanism fixed to the movable unit base, disposed on a side of a mold center with respect to the second flexible unit in a mold center direction, and configured to adsorb and hold a part of the mold holding member, wherein the control unit causes the holding mechanism to absorb and hold the part of the mold holding member during the contact, and after the contact when a separation operation for detaching the mold from the imprinting material on the substrate is performed.

9. The imprinting apparatus according to claim 3, wherein rigidity of the second flexible member is lower than rigidity of the first flexible member.

10. The imprinting apparatus according to claim 3, further comprising:

a magnification correction mechanism configured to apply a compression force from side surfaces of the mold;

a third flexible member configured to extend in a horizontal direction from the magnification correction mechanism and have flexibility in a direction of the contact; and a second measurer configured to measure a strain amount or a deformation amount in vicinity of the third flexible member, wherein the control unit controls driving of the first driving mechanism based on a measurement value output by the first measurer and a measurement value output by the second measurer.

11. The imprinting apparatus according to claim 3, wherein the second flexible member is disposed outside of a cavity space, wherein the cavity space is for deforming the mold when the mold is brought into contact with the imprinting material on the substrate.

12. The imprinting apparatus according to claim 3, further comprising a radiation unit configured to radiate energy for curing to the imprinting material on the substrate with the mold being brought into contact with the imprinting material on the substrate, and wherein the control unit controls the first driving mechanism so that a measurement value output by the first measurer becomes a target value when the radiation unit starts radiating the energy.

13. The imprinting apparatus according to claim 12, further comprising:

a second driving mechanism disposed on a side of a mold center with respect to the second flexible unit and configured to be able to generate a force or displacement of the imprinting head in a driving direction during the contact with a part of the mold holding member, wherein the control unit controls the second driving mechanism to correct a position of the mold holding member when the radiation unit starts radiating the energy.

14. The imprinting apparatus according to claim 3, wherein the second flexible member has a cavity portion, and a gas pipeline for adsorbing the mold or inflating the mold is disposed in the cavity portion.

15. The imprinting apparatus according to claim 14, wherein the cavity portion and an external form of a cross-sectional shape of the second flexible member are rectangular or hexagonal.

* * * * *